United States Patent [19]

Schultz et al.

[11] 4,251,771
[45] Feb. 17, 1981

[54] MAGNETIC SYSTEM FOR ELECTRICAL CURRENT INDICATING METER

[75] Inventors: William J. Schultz, Lynnfield, Mass.; Carl F. Van Bennekom, Green Valley, Ariz.

[73] Assignee: General Electric Company, New York, N.Y.

[21] Appl. No.: 948,172

[22] Filed: Oct. 2, 1978

[51] Int. Cl.³ .............................................. G01R 1/20
[52] U.S. Cl. .................................. 324/150; 324/154 R
[58] Field of Search ............... 324/150, 151 R, 151 A, 324/154 R, 154 PB

[56] References Cited
U.S. PATENT DOCUMENTS

| | | | |
|---|---|---|---|
| 2,866,138 | 12/1958 | Young | 324/150 |
| 3,041,536 | 6/1962 | Horan | 324/151 |
| 3,204,184 | 8/1965 | Roper | 324/150 |
| 3,528,357 | 9/1970 | Bertram | 324/154 |
| 3,611,222 | 10/1971 | Sauvignet | 335/222 |
| 3,621,393 | 11/1971 | Pignolet | 324/150 |
| 4,064,457 | 12/1977 | Boreas | 324/150 |

Primary Examiner—Michael J. Tokar
Attorney, Agent, or Firm—W. C. Bernkopf; P. L. Schlamp

[57] ABSTRACT

A compact and symmetrically arranged construction for electrical current indicating meters of small size. The novel construction for a meter comprises combinations of magnet components including the matching of a permanent magnet with a flux conducting non-permanent magnetic body.

5 Claims, 4 Drawing Figures

MAGNETIC SYSTEM FOR ELECTRICAL CURRENT INDICATING METER

CROSS-REFERENCE TO RELATED APPLICATIONS

The subject application is related to the application of Edward F. Scannell and Edward D. Orth entitled Shielded Electrical Current Indicating Meter, filed Oct. 2, 1978, Ser. No. 948,197, and assigned to the same assignee as the subject application. This application also relates to the application of Carl F. Van Bennekom, Edward F. Scannell and Donald E. Rogers entitled Electrical Current Indicating Meter, filed Oct. 2, 1978, Ser. No. 948,173, and assigned to the same assignee as the subject application.

This application further relates to the application of William J. Schultz and Carl F. Van Bennekom entitled Pivot Insert Method And Article, filed Oct. 2, 1978, Ser. No. 948,191, and assigned to the same assignee as the subject application.

Further this application relates to the application of Edward F. Scannell entitled Adjustable Spring Regulator For Setting Indicating Instrument Pointer, filed Oct. 2, 1978, Ser. No. 948,174, and assigned to the same assignee as the subject application.

Still further this application relates to the application of Edward F. Scannell and Donald E. Rogers entitled Means For Adjusting The Zero Point Setting Of A Meter filed Oct. 2, 1978, Ser. No. 948,171, and assigned to the same assignee as the subject application.

BACKGROUND OF THE INVENTION

The invention of this disclosure relates to small electrical current indicating meters of the general type disclosed in U.S. Pat. Nos. 3,621,393 and 4,064,457, and the references cited therein.

SUMMARY OF THE INVENTION

This invention comprises a new and improved, symmetrical construction for small sized electrical current indicating meters comprising cooperating magnet units or components of combined pairs of a permanent magnet and a flux conducting non-permanent magnet body which together provide greater versatility in the assembly and performance of the meter and savings in material costs and manufacture.

OBJECTS OF THE INVENTION

It is a primary object of this invention to provide a new construction for electrical current indicating meters which is more versatile and economical in manufacture and service.

It is also an object of this invention to provide a small compact electrical current indicating meter constructed of cooperating magnet units or components which simplify manufacture of components and reduce material costs.

It is a further object of this invention to provide an improved construction for electrical current indicating meters which renders it feasible and advantageous to significantly lower material costs by reducing the number of expensive components comprising costly magnetic materials or permanent magnets while maintaining effectiveness and versatility of the device.

It is a still further object of this invention to provide a compact electrical current indicating meter construction which advantageously lends itself to the use of low cost parts of components which in combination or cooperation with high coercive permanent magnets or magnetic material provide high strength or intensity magnetic flux fields of variable patterns or circuits with a reduced number of expensive permanent magnets.

DESCRIPTION OF A PREFERRED EMBODIMENT

Figure 1:
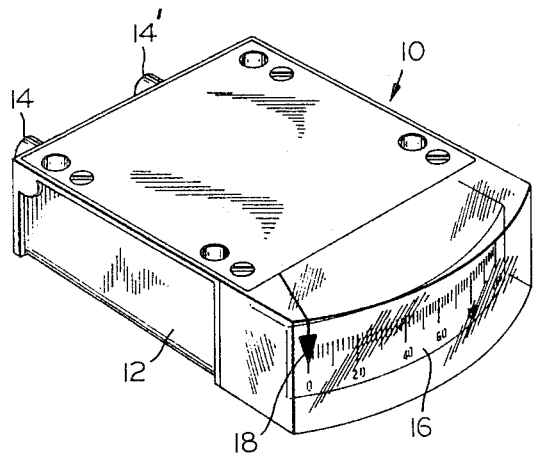
FIG. 1 is a perspective view of the electrical current indicating meter of this invention.
Figure 2:
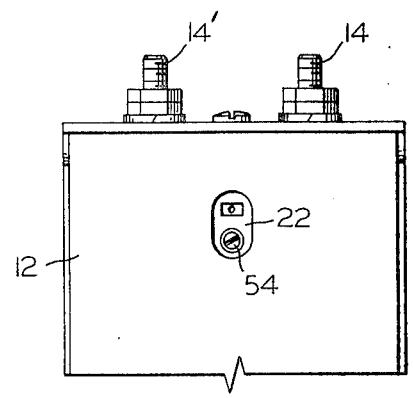
FIG. 2 is a partial bottom view of the meter of FIG. 1.

Referring to the drawings, FIG. 1 shows a meter product 10 of a preferred embodiment of this invention, comprising a housing 12, provided with terminals 14 and 14' for making electrical connections with the meter, and a visual scale 16 in association with a pointer 18 for indicating the measured quantity of electrical current determined by the meter.

Figure 3:
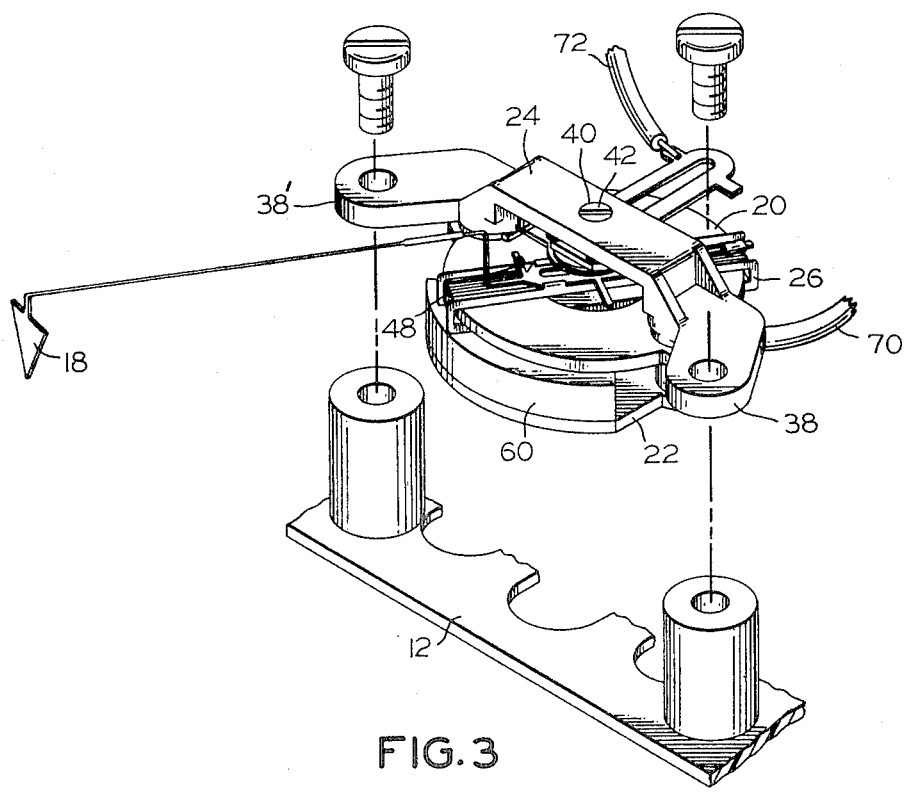
FIG. 3 is a partially exploded view showing the assemblage of the primary current indicating mechanism of the meter and the means for mounting same in a housing.
Figure 4:
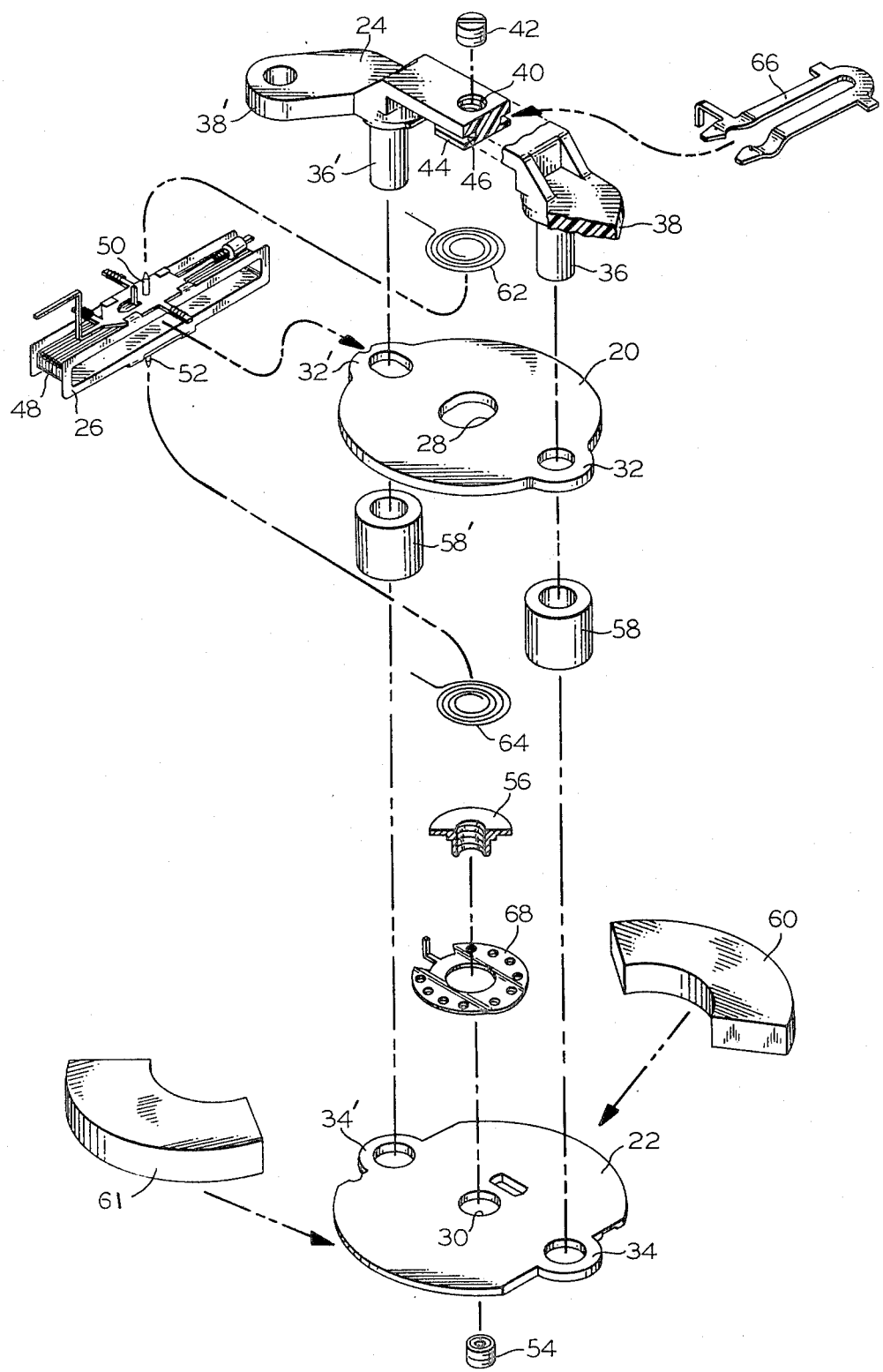
FIG. 4 is a fully exploded view of the primary current indicating mechanism.

The primary electrical current measuring mechanism, or the basic units therefor of a preferred embodiment of the meter construction of this invention, as shown in detail in FIGS. 3 and 4, comprises a pair of spaced apart, parallel flux plates 20 and 22 formed from a suitably magnetic flux conducting metal or "soft" magnetic material such as iron or soft steel; a frame member 24 formed of a non-magnetic material; and a rotor assembly 26.

Spaced apart, parallel flux plates 20 and 22 of the preferred embodiment are of a generally flat ellipsoidal or disk-like configuration to easily accommodate within their intermediate perimeter one or more magnetic units of various size or capacity. Each rounded or oval plate 20 and 22 is provided with a central orifice 28 and 30, respectively, and a pair of outward projecting perforated ears 32 - 32' and 34 - 34' for mounting in a predetermined spaced apart, parallel relationship with respect to each other, and the other components of the meters.

Frame member 24 is provided with a pair of generally parallel studs 36 - 36' which are arranged to align with and pass through the perforations in ears 32 - 32' and 34 - 34' of plates 20 and 22, respectively, and thereby join and secure these components together in an appropriate spaced apart parallel relationship. Frame 24 is additionally preferably provided with a pair of laterally or outwardly extending arms 38 - 38', also perforated, for the mounting, such as with bolts, of the primary current measuring mechanism within a meter housing 12, or in an appropriate electrical device. Also, in the preferred embodiment, frame 24 is provided with a central orifice 40 for receiving jewel bearing 42, and can include an integrally molded or formed washer element 44 comprising a projecting portion or boss having a circumferential groove 46 thereabout for cooperation with a regulator or adjusting means.

Frame member 24 is formed from a non-magnetic or non-flux conducting material such as die cast metal or dielectric organic polymeric material, for example, a glass filled blend of polyphenylene oxide and polystyrene, such as General Electric Company's NOREL plastic.

Rotor assembly 26 comprises an electromagnetic coil 48 which is of apt dimensions and configuration to closely surround the ellipsoidal flux plate 20, a pointer 18, and a pair of oppositely extending pivot shaft or staff members 50 and 52 for mounting the overall assembly 26 for rotational movement back and forth in an arcuate path in the same plane as the flux plates 20 and 22. Pivots 50 and 52, respectively, extend to and rest in jewel bearings 42 and 54. Bearing 42 is threaded into frame member 24, and bearing 54 is threaded into a bushing 56 inserted in the central orifice 30 of flux plate 22 which is mounted on studs 36 - 36' the furthest from frame member 24, in parallel relationship with plate 20.

As shown in the drawings, in assembly, flux plate 20 is mounted closest to frame member 24 with the frame member studs 36 - 36' passing through the perforations or openings in its ears 32 - 32', and flux plate 22 is similarly mounted parallel thereto farthest from frame member 24 with studs 36 - 36' also passing through the perforations or openings of its ears 34 - 34'. Spacing posts or cylinders 58 - 58' can be used surrounding studs 36 - 36' and positioned intermediate the parallel flux plates 20 and 22 to provide a predetermined spacing between the plates. Thus, any required or desired distance between parallel flux plates 20 and 22 can readily be unerringly achieved in assembly and positively maintained, or changed by the use of spacing posts of appropriate dimensions or length. Spacing posts 58 - 58' are composed of a non-magnetic of non-flux conducting material such as a dielectric plastic.

In accordance with this invention, the magnet system comprises one or more pairs of magnet units, with one of the units of a pair consisting of a permanent or "hard" magnet 60 of high coercive properties, such as a cobalt-rare earth alloy magnet, with the other in the units of a pair consisting of a magnetizable or magnetic flux conducting magnet body 61 or so-called "soft" magnet of materials such as iron or soft steel. The pair or pairs of magnet units 60 and 61 are appropriately deployed in symmetrical counterposed relationship with respect to each other and concentrically on either side of the pivot post 52 comprising the coil pivot point, as illustrated units 60 and 61, and thus positioned intermediate the flux plates 20 and 22, on the inner surface of flux plate 22 which is farthest from frame member 24, and there secured by any suitable means such as an adhesive or equivalent securing means. With the magnet units thus arranged, the magnetic flux circuit or pattern can be directed from the single permanent magnet 60 to pass through the flux conducting plates 20 and 22 and to return back through the flux conducting body or "soft" magnet 61 to complete the circuit by separating or insulating the two flux conducting plates 20 and 22 from each other with mounting studs 36 - 36' and spacing posts 56 - 56' composed of non-flux conducting or dielectric materials such as die cast metal or organic polymers. For example, as shown in a preferred embodiment in the drawings, the magnet units 60 and 61 may comprise a matched pair of a permanent or "hard" magnet 60 of cobalt-samarium alloy in an arcuate shape positioned opposite a "soft" of magnetic flux conducting soft iron body 61 of comperable arcuate shape in a symmetrical counterposed relationship concentrically positioned on opposite sides of the pivot post 52 extending from the rotor assembly 26 to the bearing 56 in the flux plate 22. This arrangement provides a high density and strength flux system with only one costly, high coercive permanent magnet and a low cost magnetic flux directing body of iron or soft steel.

The spacing between parallel flux plates 20 and 22 is such as to provide a sufficient air gap or space between the magnet units 60 and 61 positioned on the inner surface of flux plate 22, and the inner surface of flux plate 20 to aptly accommodate the free rotational movement of coil 48, or the intervening portion thereof, through the gap without contacting either the magnets or the flux plates.

Upper and lower control springs 62 and 64 bear against the rotor assembly 26 to appropriately bias its alignment and pointer 18 in relation to the scale 16, and to provide suitable torque resistance to rotary movement of the rotor assembly when such movement is induced by electromagnetic forces resulting from current flowing through the coil, and thereafter return the rotor assembly and its pointer when the forces are terminated.

A regulator arm 66, which connects with washer element 44 of frame 24, is provided to adjust or synchronize the terminal position or setting of the rotor assembly 26 with its pointer 18 at a given indice, such as zero of the scale 16.

Also, an adjustable spring regulator disk 68 can be included to change the tension of the spring 64.

Electrical conductors for carrying current to the electrically sensitive or activated meter components, such as the electromagnetic coil, for measurement, are provided by insulated wires 70 and 72 shown in FIG. 3. In a preferred embodiment, wires 70 and 72, respectively, connect terminals 14 and 14' with flux plate 22 and with regulator arm 66 which in turn makes electrical contact with the electromagnetic coil 48 through upper control spring 62.

The electrical current indicating and measuring meter mechanism or apparatus of this invention, as will be apparent to those skilled in this art, operates on the D'Arsonval principle which is well known and understood in the art, for instance, note the disclosure of U.S. Pat. Nos. 3,621,393 and 4,064,457.

However, the distinctive construction for the meter of this invention places the pivotal position and pivot means for the rotor assembly substantially intermediate the length of the electromagnetic coil and generally concentric with the flux plates, and it also provides for the symmetrical positioning of a magnet unit on each side of the pivotal position and the coil. Thus, the end portions of the electromagnetic coil extend approximately equally outward from the concentric pivotal position in opposite directions with each portion of the coil projecting over or into the area of influence or force of the flux field of one of the two magnet units.

What we claim as new and desire to secure by Letters Patent of the United States is:

1. In an electrical current indicating meter mechanism having an inner and an outer parallel flux plate, a pair of pivots, a rotor assembly having a coil surrounding said inner flux plate, said rotor assembly mounted for rotational movement in the same plane as said inner flux plate, a pair of bearings, at least one permanent magnet positioned on the side of said outer flux plate facing said inner flux plate, means for supplying current to the coil of the rotor assembly, a non-magnetic frame member having two parallel projecting studs for securing thereto the inner and outer parallel flux plate, said rotor assembly being mounted for rotation on said pair of pivots with one of said pivots extending to the bearing affixed to the frame member and the other pivot extending to the bearing affixed to the outer flux plate wherein the improvement comprises a pair of non-magnetic spacer posts and at least one flux conducting member positioned in symmetrical counterposed relationship to said permanent magnet on the side of said outer flux plate facing said inner flux plate, said inner and outer flux plates being separated by said non-magnetic spacer whereby the return flux path from the permanent magnet passes through said flux conducting body.

2. The meter mechanism of claim 1 wherein the flux conducting member is made of steel.

3. The meter mechanism of claim 1, wherein the permenent magnet unit is a high coercive magnet.

4. The meter mechanism of claim 1, wherein the permanent magnet unit is a cobalt-rare earth magnet.

5. The meter mechanism of claim 1, wherein the permanent magnet unit is a cobalt-samarium magnet.

* * * * *